United States Patent
Maruyama

(10) Patent No.: US 7,201,016 B2
(45) Date of Patent: Apr. 10, 2007

(54) REFRIGERANT SUPPLY APPARATUS

(75) Inventor: Hiroyuki Maruyama, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 369 days.

(21) Appl. No.: 10/776,168

(22) Filed: Feb. 12, 2004

(65) Prior Publication Data

US 2004/0162008 A1    Aug. 19, 2004

(30) Foreign Application Priority Data

Feb. 17, 2003    (JP)    ............ 2003-038610

(51) Int. Cl.
*F25B 43/04*    (2006.01)

(52) U.S. Cl. ............ 62/475; 417/2; 417/313; 417/426

(58) Field of Classification Search ............ 62/259.2, 62/305, 474, 475; 210/155, 191, 195.4; 415/51; 417/2, 313, 426
See application file for complete search history.

(56) References Cited

U.S. PATENT DOCUMENTS

| | | | |
|---|---|---|---|
| 4,430,129 A * | 2/1984 | Gamer ............ | 134/22.19 |
| 4,440,017 A * | 4/1984 | Barton et al. ............ | 73/40.5 R |
| 5,118,422 A * | 6/1992 | Cooper et al. ............ | 210/636 |
| 5,422,487 A * | 6/1995 | Sauska et al. ............ | 250/436 |
| 5,609,033 A * | 3/1997 | Dong ............ | 62/3.64 |
| 5,820,765 A * | 10/1998 | Joung et al. ............ | 210/739 |
| 5,855,792 A * | 1/1999 | Adams et al. ............ | 210/696 |
| 6,077,437 A * | 6/2000 | Hayashi et al. ............ | 210/651 |
| 6,165,048 A * | 12/2000 | Russ et al. ............ | 451/5 |
| 6,508,695 B2 | 1/2003 | Tanikawa et al. ............ | 451/41 |
| 6,866,784 B2 * | 3/2005 | Chang et al. ............ | 210/652 |
| 7,038,759 B2 | 5/2006 | Emoto et al. ............ | 355/30 |
| 2002/0140298 A1 | 10/2002 | Maruyama ............ | 310/54 |

FOREIGN PATENT DOCUMENTS

| | | | |
|---|---|---|---|
| JP | 64-38196 A * | 2/1989 | |
| JP | 2-99187 A * | 4/1990 | |
| JP | 2000-185203 A * | 7/2000 | |

* cited by examiner

*Primary Examiner*—Mohammad M. Ali
(74) *Attorney, Agent, or Firm*—Fitzpatrick, Cella, Harper & Scinto

(57) ABSTRACT

A refrigerant supply apparatus for supplying a refrigerant to a cooling target. The apparatus includes a refrigerant supply channel through which pure water as the refrigerant is supplied to the cooling target, an impurity removing unit disposed in an impurity removing channel which is a channel different from the refrigerant supply channel, a sensor which measures a purity of the pure water, and a valve which stops supply of the pure water to the cooling target when the purity of the pure water does not satisfy a predetermined standard.

20 Claims, 6 Drawing Sheets

REFRIGERANT SUPPLY APPARATUS

FIELD OF THE INVENTION

The present invention relates to a refrigerant supply apparatus, and a device manufacturing apparatus including the same.

BACKGROUND OF THE INVENTION

Among exposure apparatuses, one is available which has a wafer stage and reticle stage for aligning a wafer and reticle by moving them at high speed, and which includes linear motors for driving the wafer stage and reticle stage. According to another exposure apparatus, a reticle is fixed, and a pattern is sequentially transferred to a plurality of shot regions by stepping a wafer. In these exposure apparatuses, to cope with heat generated by the coils of the linear motors, a fluoride solution is employed as a refrigerant. The refrigerant is supplied to portions in the vicinities of the coils of the linear motors, thus cooling the coils. The fluoride solution is widely utilized as a cooling medium because, e.g., 1) it has excellent electrical insulating properties, 2) it is completely inactive and does not attack a structural material such as a metal, plastic material, or rubber, and 3) it is incombustible.

Recently, the stage acceleration accompanying an increase in the process speed (throughput) increases more and more. As the sizes of the reticle and substrate increase, the stage mass also increases. Accordingly, the driving force defined by <mass of moving body>*<acceleration> becomes very large. The amount of heat generated by the linear motor for driving the stage also increases. The environmental influence of the generated heat is becoming apparent as an issue.

Conventionally, in the manufacturing process for a semiconductor element, e.g., an LSI or VLSI, formed to have a micropattern, a reduction projection exposure apparatus is used, which reduces and projects a circuit pattern formed on a mask onto a substrate coated with a photosensitive agent, and exposes it. As the integration density of the semiconductor elements increases, the pattern feature size decreases more and more, and accordingly high-accuracy alignment is required. Heat generated by the linear motor causes temperature increase or fluctuation in the stage space or in the vicinity of the linear motor where a mirror and the optical axis of an interferometer used in measurement for alignment are arranged. This decreases measurement accuracy of the interferometer.

To suppress problems resulting from the heat generated by the linear motor, the amount of coolant increases rapidly. A fluoride solution widely used as the cooling medium has a smaller heat capacity and a larger specific gravity than those of water. Thus, the amount of coolant increases, and the load on equipment, such as a pump, increases accordingly. Also, equipment, such as a heat exchanger, a transport pump, and the like, to be used, increase in size, leading to a very large cooling system.

SUMMARY OF THE INVENTION

The present invention has been made in view of the above situation, and has as its object to provide a refrigerant supply apparatus which contributes to, e.g., downsizing of a cooling system, and a device manufacturing apparatus including such a refrigerant supply apparatus.

The present invention according to its first aspect relates to a refrigerant supply apparatus, which supplies a refrigerant to a cooling target, comprising a refrigerant supply channel through which pure water (e.g., the resistivity of the pure water is preferably 1 MΩ·cm or more, and/or the dissolved oxygen amount is preferably 1 mg or less per liter) as the refrigerant is supplied to the cooling target, and an impurity removing unit disposed in an impurity removing channel, which is a channel different from the refrigerant supply channel.

According to a preferred embodiment of the present invention, preferably, the apparatus further comprises a pure water tank which stores the pure water. Preferably, an upstream side of the refrigerant supply channel is connected to the pure water tank, and the impurity removing channel circulates the pure water through the pure water tank.

According to a preferred embodiment of the present invention, a lower portion of the pure water tank preferably has a tapered shape.

According to a preferred embodiment of the present invention, the apparatus preferably further comprises an oxygen removing mechanism which removes dissolved oxygen in the pure water by supplying an inert gas into the pure water tank. For example, the oxygen removing mechanism supplies the inert gas into the pure water in the pure water tank.

According to a preferred embodiment of the present invention, the impurity removing unit preferably includes at least one of an ion exchange resin, active carbon, a filtration film, a reverse osmosis film, a distillation unit, and a deaeration film.

According to a preferred embodiment of the present invention, the apparatus preferably further comprises a germicidal lamp which sterilizes the pure water.

According to a preferred embodiment of the present invention, the apparatus preferably further comprises a sensor which measures a purity of the pure water, and a valve which stops supply of the pure water to the cooling target when the purity of the pure water does not satisfy a predetermined standard.

According to a preferred embodiment of the present invention, the apparatus preferably further comprises a first pump provided to the refrigerant supply channel, and a second pump provided to the impurity removing channel. The first and second pumps are preferably controlled independently of each other, such that the first pump is stopped when the purity of the pure water does not satisfy the predetermined standard, and that the second pump is stopped when the purity of the pure water satisfies the predetermined standard.

According to a preferred embodiment of the present invention, the sensor preferably includes a resistivity sensor and/or a dissolved oxygen sensor.

According to a preferred embodiment of the present invention, the apparatus preferably further comprises a temperature adjustment unit which adjusts a temperature of the pure water.

The present invention according to its second aspect relates to a device manufacturing apparatus comprising the refrigerant supply apparatus described above as part of a cooling apparatus.

The present invention according to its third aspect relates to an exposure apparatus comprising the refrigerant supply apparatus described above as part of a cooling apparatus.

The present invention according to its fourth aspect relates to a device manufacturing apparatus comprising a driving section which generates heat, a refrigerant supply channel through which pure water as a refrigerant is supplied to a cooling section that cools the driving section, a sensor which is disposed in the refrigerant supply channel and measures the purity of the pure water, and a controller which controls supply of the pure water to the cooling section on the basis of the purity of the pure water measured by the sensor.

According to a preferred embodiment of the present invention, the controller preferably stops supply of the pure water to the cooling section when the purity of the pure water does not satisfy a predetermined standard.

According to a preferred embodiment of the present invention, the sensor preferably includes a resistivity sensor and/or a dissolved oxygen sensor.

According to a preferred embodiment of the present invention, the apparatus preferably further comprises an impurity removing unit which removes impurities in the pure water.

According to a preferred embodiment of the present invention, the impurity removing unit can be disposed in an impurity removing channel which is a channel different from the refrigerant supply channel.

According to a preferred embodiment of the present invention, the apparatus preferably further comprises a first pump provided to the refrigerant supply channel, and a second pump provided to the impurity removing channel. The first and second pumps are preferably controlled independently of each other, such that the first pump is stopped when the purity of the pure water does not satisfy the predetermined standard, and that the second pump is stopped when the purity of the pure water satisfies the predetermined standard.

According to a preferred embodiment of the present invention, the impurity removing unit can be disposed in a branch channel of the refrigerant removing channel.

According to a preferred embodiment of the present invention, the impurity removing unit preferably includes at least one of an ion exchange resin, active carbon, a filtration film, a reverse osmosis film, a distillation unit, and a deaeration film.

According to a preferred embodiment of the present invention, the apparatus preferably further comprises a germicidal lamp which sterilizes the pure water.

According to a preferred embodiment of the present invention, preferably, the apparatus preferably further comprises a pure water tank which stores the pure water, and an upstream side of the refrigerant supply channel is connected to the pure water tank. A lower portion of the pure water tank preferably has a tapered shape.

According to a preferred embodiment of the present invention, the apparatus preferably further comprises an oxygen removing mechanism which removes dissolved oxygen in the pure water by supplying an inert gas into the pure water tank.

According to a preferred embodiment of the present invention, the oxygen removing mechanism preferably supplies the inert gas into the pure water in the pure water tank.

According to a preferred embodiment of the present invention, the apparatus preferably further comprises a temperature adjustment unit which adjusts a temperature of the pure water.

According to a preferred embodiment of the present invention, for example, the apparatus can be formed as an exposure apparatus.

The present invention according to its fifth aspect relates to a device manufacturing method including a step of processing a substrate using the device manufacturing apparatus described above.

The present invention according to its sixth aspect relates to a device manufacturing method including steps of transferring a pattern to a substrate with a device manufacturing apparatus formed as the exposure apparatus described above, and developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described.

According to the preferred embodiments of the present invention, pure water is used as a cooling medium for a cooling system in a device manufacturing apparatus, such as a semiconductor exposure apparatus, so that equipment (e.g., a pump, a refrigerant temperature adjustment unit, a flow channel, and the like) that constitute the cooling system are made compact, and the entire cooling system is made compact. As water has a heat recovering ability almost twice that of fluoride solution, the heat recovery amount can be increased without increasing the flow rate of the cooling medium.

Water can rot equipment when it is left for a long period of time, and may corrode metal, or the like. As water does not have electrical insulating properties, it causes short circuiting in electronic equipment. In view of this, according to the preferred embodiments of the present invention, not general tap water or industrial water, but pure water, is used as the cooling medium. The purity (quality) of the pure water can be improved by an impurity removing unit. Supply of the pure water to a cooling target (e.g., a driving section such as a linear motor) can be stopped by a controller (e.g., a valve and its control unit) when the pure water does not have a predetermined purity. The purity of pure water can be measured by a sensor as, e.g., a resistivity and/or a dissolved oxygen amount. For example, the purity of the pure water is preferably 1 MΩ·cm or more in resistivity, and/or the dissolved oxygen amount is preferably 1 mg or less per liter. When the purity (water quality) of the pure water is managed, corrosion of the metal, or the like, can be prevented, and electrical insulating properties can be ensured.

When the refrigerant supply apparatus according to the present invention is applied to a device manufacturing apparatus, for example, a driving section such as a linear motor can be cooled highly efficiently, so that the entire apparatus can be made compact.

When the refrigerant supply apparatus according to the present invention is applied to an exposure apparatus, for example, fluctuation of the stage space due to heat generated by a coil is suppressed, and the alignment accuracy of the stage in the exposure process is improved, so that the overlay accuracy and line width accuracy can be improved. Also, since the influence of heat generated by the coil, which increases as the stage acceleration increases, is suppressed, the throughput can be increased, and an exposure process with higher accuracy and higher productivity than in the prior art can be performed.

FIRST EMBODIMENT

Figure 1:
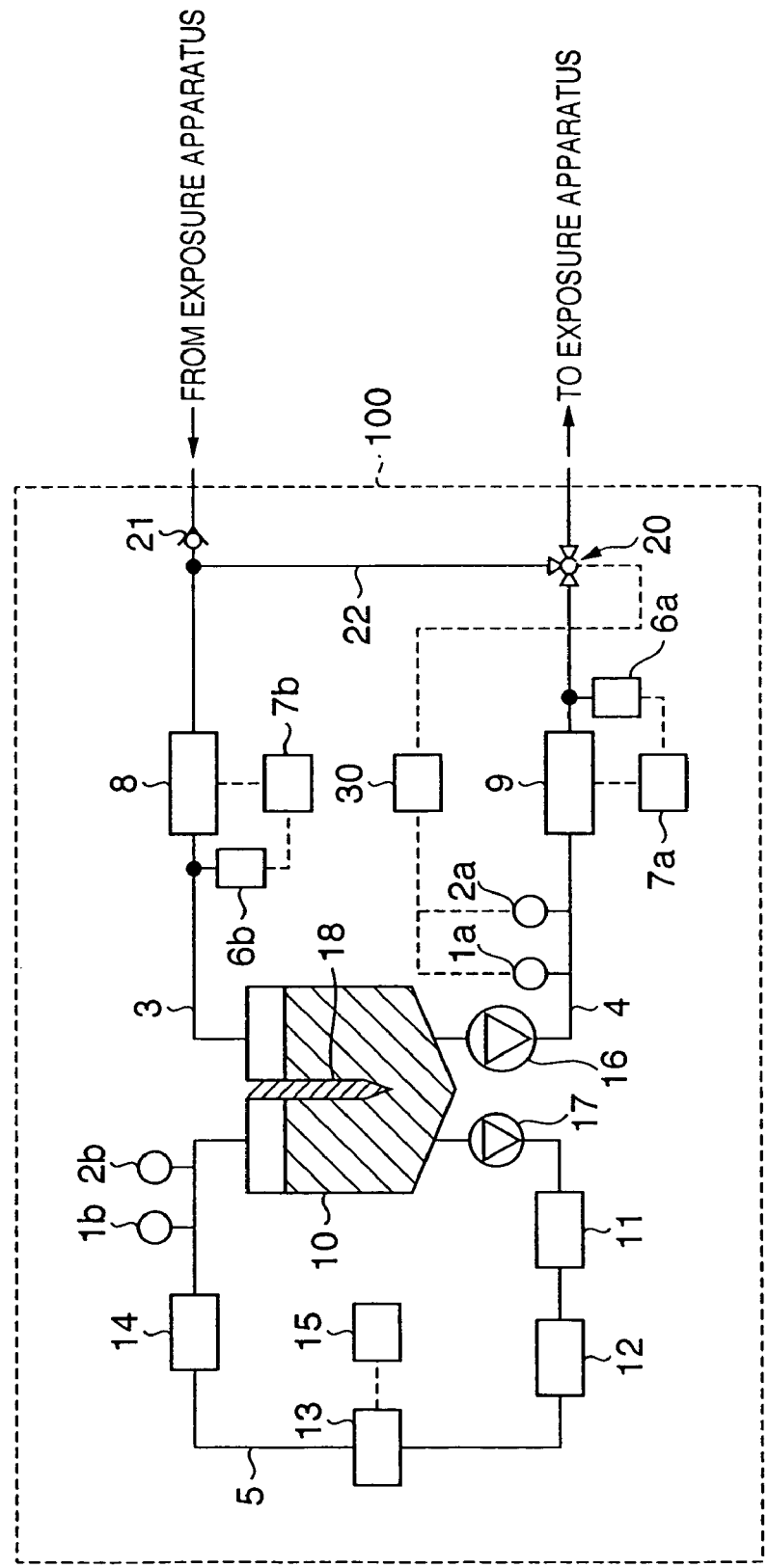
FIG. 1 is a diagram showing the schematic arrangement of a pure water supply apparatus (refrigerant supply apparatus) according to the first embodiment of the present invention.

FIG. 1 is a schematic diagram of a pure water supply system (refrigerant supply system) according to the first embodiment of the present invention. A pure water supply system 100 of this embodiment has a channel (pure water supply channel) 4 through which pure water is supplied, a return channel (pure water return channel) 3, a channel (impurity removing channel) 5 through which impurities in the pure water are removed, and a storage tank 10.

The pure water supplied from the storage tank 10 flows in the pure water supply channel 4 through a pump 16, is heated to a predetermined temperature by a heater 9 disposed in the pure water supply channel 4, and is then supplied to a cooling target in the exposure apparatus, to cool the cooling target. The cooling target can be exemplified by, e.g., a linear motor, a wafer chuck, or the like.

A dissolved oxygen meter 1a and resistivity meter 2a are connected to the pure water supply channel 4. The dissolved oxygen meter 1a and resistivity meter 2a measure the dissolved oxygen value and resistivity value, respectively, of the pure water. The measurement results are sent to a controller 30. If the dissolved oxygen value and resistivity value respectively satisfy their regulated values (e.g., the dissolved oxygen value should be 1 mg or less per liter, and the resistivity should be 1 MΩ·cm or more), the controller 30 opens a flow channel selector valve 20 to the exposure apparatus, so that the pure water is supplied to the exposure apparatus. If either one of the dissolved oxygen value and resistivity value does not satisfy its regulated value, the controller 30 controls the valve 20 to stop supply of the pure water to the exposure apparatus, and returns the pure water to the tank 10 through an internal circulation channel 22 (this state will be referred to as internal circulation hereinafter). In other words, the quality of the pure water to be supplied to the exposure apparatus is managed by the controller 30.

The pure water return channel 3 is provided with a check valve 21. The check valve 21 prevents the pure water from flowing reversely into the exposure apparatus when the valve 20 is switched to internal circulation.

In this manner, in the pure water supply apparatus 100, if either one of the dissolved oxygen value and resistivity value does not satisfy its regulated value (e.g., the dissolved oxygen value should be 1 mg or less per liter, and the resistivity should be 1 MΩ·cm or more), the pure water is circulated in the pure water supply apparatus 100. The pure water is supplied to the exposure apparatus only after its dissolved oxygen value and resistivity value satisfy their regulated values. When the pure water is circulated in the pure water supply apparatus 100, the temperature of the pure water can also be managed.

A temperature sensor 6a is provided to the outlet of the heater 9. A controller 7a controls the heater 9 on the basis of the measurement result of the temperature sensor 6a, so that the pure water is heated to a predetermined temperature.

When the temperature of the pure water increases as it cools the cooling target in the exposure apparatus, the pure water is cooled to the predetermined temperature by a cooler 8 disposed in the pure water return channel 3. A temperature sensor 6b is provided to the outlet of the cooler 8. A controller 7b controls the cooler 8 on the basis of the measurement result of the temperature sensor 6b, so that the pure water is cooled to the predetermined temperature. After flowing through the cooler 8, the pure water returns to the storage tank 10 through the pure water return channel 3. The bottom of the storage tank 10 is tapered so that no liquid reservoir or the like is formed after the pure water is drained completely.

Part of the pure water stored in the storage tank 10 is sent to the impurity removing channel 5 by a pump 17 for the purpose of maintaining the water quality. A filtration film 11 for removing dust such as particles, an ion exchange resin 12 for removing ions in the pure water, a deaeration film 13 for removing any dissolved gas in the pure water by using a vacuum pump 15, and an activated carbon filter 14 for removing any organic substance in the pure water are provided to the impurity removing channel 5. The resultant impurity removing unit removes impurities in the pure water. The storage tank 10 has a germicidal lamp 18 which can sterilize microbes. The impurity removing unit may have only some of the filtration film 11, ion exchange resin 12, deaeration film 13, and activated carbon filter 14 described above, or may have at least one of, e.g., a reverse osmosis film and distillation unit, in addition to or in place of them.

In place of the deaeration film 13, nitrogen may be charged in the space in the storage tank 10 or in the pure water in the storage tank 10, so that dissolved oxygen in the pure water may be removed.

A dissolved oxygen meter 1b and resistivity meter 2b provided to the impurity removing channel 5 can manage the performance and service life of the ion exchange resin 12 and deaeration film 13.

The pump 17 can be operated independently of the pump 16 that supplies the pure water to the exposure apparatus. Hence, the pump 17 can adjust the amount of water flowing through the impurity removing channel 5 in accordance with the quality of the pure water. For example, if the quality of the water to be supplied to the exposure apparatus is equal to or more than the regulated value, operation of the pump 17 may be stopped, so that power saving can be achieved.

Figure 3:
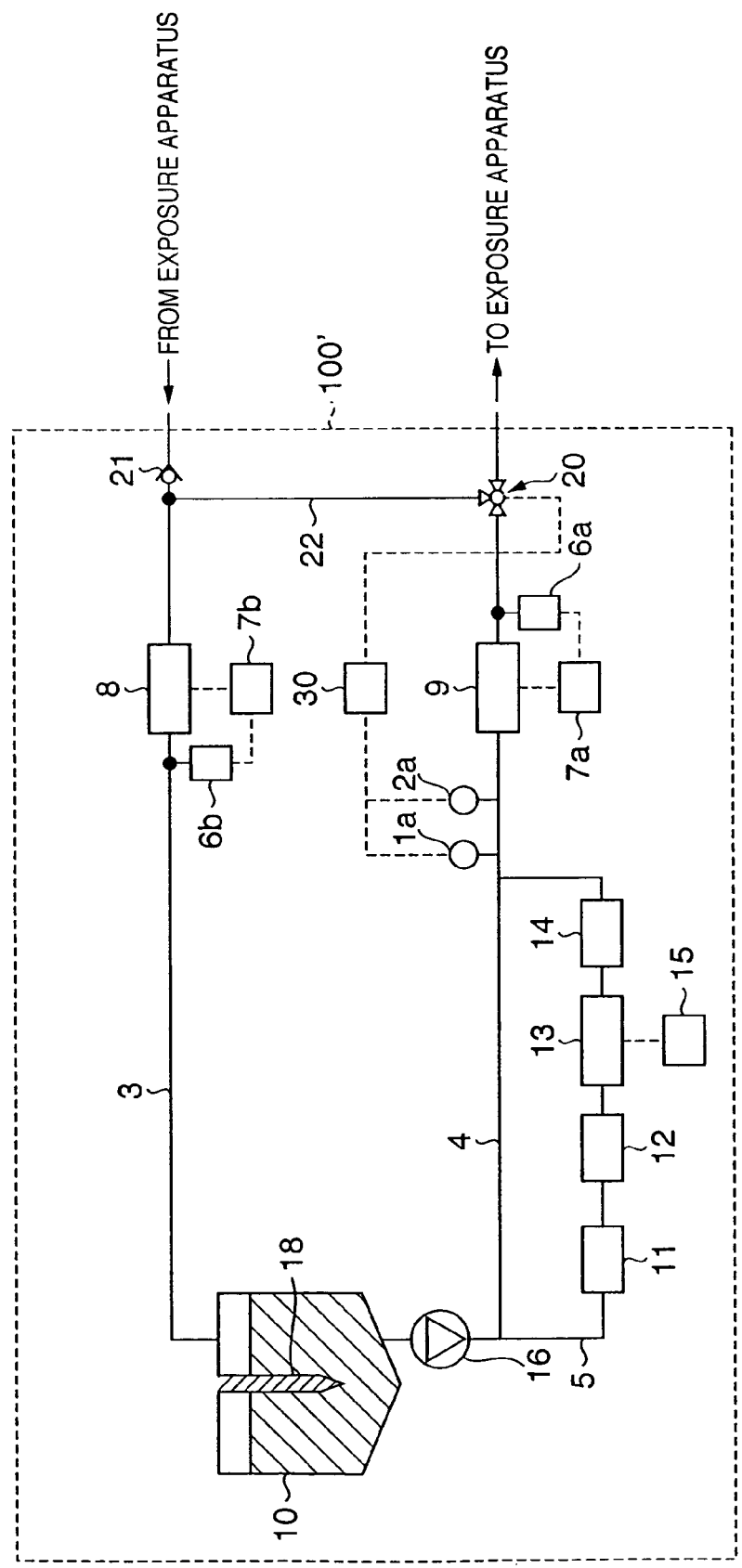
FIG. 3 is a diagram schematically showing a modification of the refrigerant supply apparatus.

Alternatively, the pump 17 need not be disposed, but the channel may be branched at the outlet of the pump 16 into the pure water supply channel 4 and impurity removing channel 5, so that only one pump is used. In this case, the outlet of the impurity removing channel 5 is not connected to the tank 10, but can be connected to the pure water supply channel 4, as shown in FIG. 3, so that the pure water flowing through the impurity removing channel 5 can be supplied to the exposure apparatus directly.

Typically, the respective units disposed in the impurity removing channel 5 are sufficient as far as they can process pure water having a flow rate smaller than that of the pure water to be supplied to the exposure apparatus. Hence, even if the apparatus increases in size due to the presence of the impurity removing channel 5, the size increase may be within an allowable range. More specifically, when the impurity removing channel 5 is provided independently of the pure water supply channel 4 and an impurity removing unit is disposed in the impurity removing channel 5, the pure water supply apparatus 100 can be made compact.

SECOND EMBODIMENT

Figure 2:
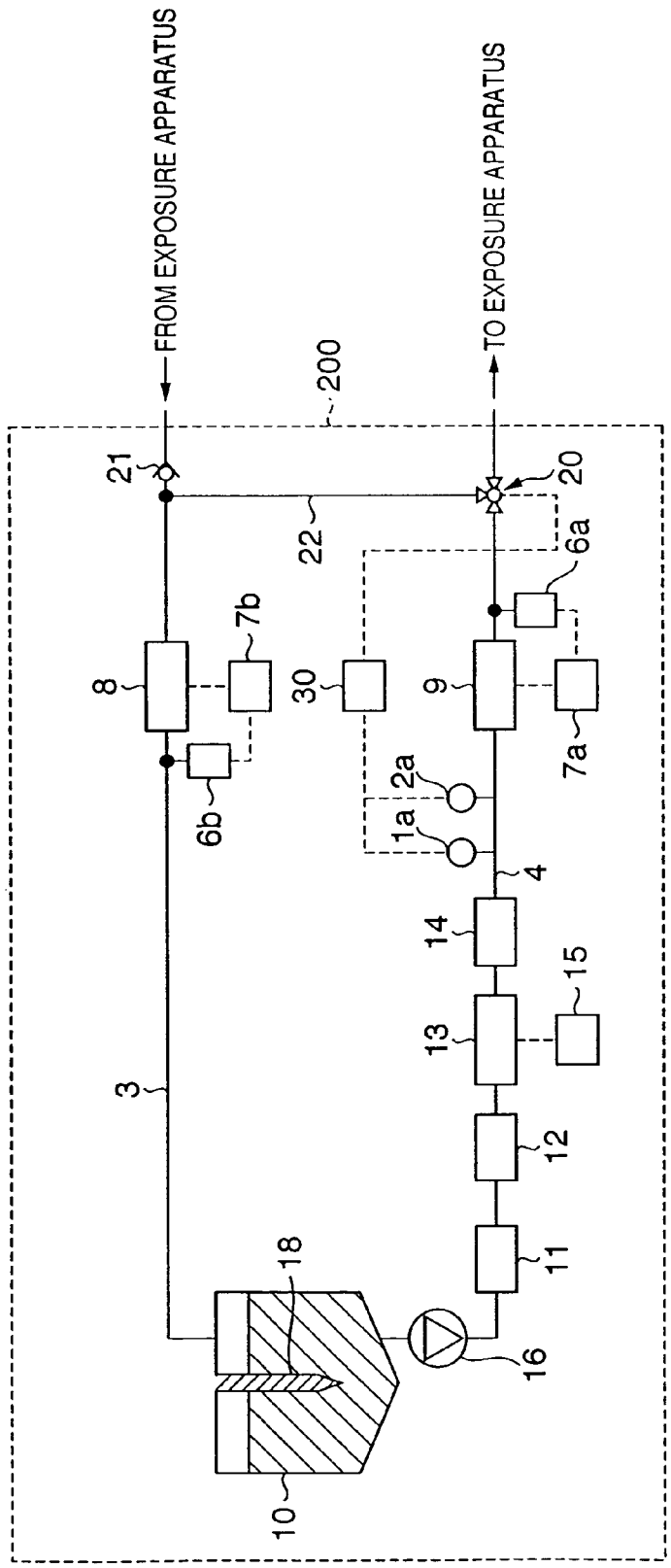
FIG. 2 is a diagram showing the schematic arrangement of a pure water supply apparatus (refrigerant supply apparatus) according to the second embodiment of the present invention.

FIG. 2 is a schematic diagram of a pure water supply system according to the second embodiment of the present invention. A pure water supply system 200 of this embodiment has a pure water supply channel 4, pure water return channel 3, and storage tank 10.

The pure water supplied from the storage tank 10 flows in the pure water supply channel 4 through a pump 16, is heated to a predetermined temperature by a heater 9 disposed in the pure water supply channel 4, and is then supplied to a cooling target in the exposure apparatus, to cool the cooling target. The cooling target can be exemplified by, e.g., a linear motor, a wafer chuck, or the like.

A dissolved oxygen meter 1*a* and resistivity meter 2*a* are connected to the pure water supply channel 4. The dissolved oxygen meter 1*a* and resistivity meter 2*a* measure the dissolved oxygen value and resistivity value, respectively, of the pure water. The measurement results are sent to a controller 30. If the dissolved oxygen value and resistivity value respectively satisfy their regulated values (e.g., the dissolved oxygen value should be 1 mg or less per liter, and the resistivity should be 1 MΩ·cm or more), the controller 30 opens a flow channel selector valve 20 to the exposure apparatus, so that the pure water is supplied to the exposure apparatus. If either one of the dissolved oxygen value and resistivity value does not satisfy its regulated value, the controller 30 controls the valve 20 to stop supply of the pure water to the exposure apparatus, and returns the pure water to the tank 10 through an internal circulation channel 22 (internal circulation). In other words, the quality of the pure water to be supplied to the exposure apparatus is managed by the controller 30.

The pure water return channel 3 is provided with a check valve 21. The check valve 21 prevents the pure water from flowing reversely into the exposure apparatus when the valve 20 is switched to internal circulation.

In this manner, in the pure water supply apparatus 200, if either one of the dissolved oxygen value and resistivity value does not satisfy its regulated value (e.g., the dissolved oxygen value should be 1 mg or less per liter, and the resistivity should be 1 MΩ·cm or more), the pure water is circulated in the pure water supply apparatus 200. The pure water is supplied to the exposure apparatus only after its dissolved oxygen value and resistivity value satisfy their specified values. When the pure water is circulated in the pure water supply apparatus 200, the temperature of the pure water can also be managed.

A temperature sensor 6*a* is provided to the outlet of the heater 9. A controller 7*a* controls the heater 9 on the basis of the measurement result of the temperature sensor 6*a*, so that the pure water is heated to a predetermined temperature.

When the temperature of the pure water increases as it cools the cooling target in the exposure apparatus, the pure water is cooled to the predetermined temperature by a cooler 8 disposed in the pure water return channel 3. A temperature sensor 6*b* is provided to the outlet of the cooler 8. A controller 7*b* controls the cooler 8 on the basis of the measurement result of the temperature sensor 6*b*, so that the pure water is cooled to the predetermined temperature. After flowing through the cooler 8, the pure water returns to the storage tank 10 through the pure water return channel 3. The bottom of the storage tank 10 is tapered so that no liquid reservoir or the like is formed after the pure water is drained completely.

A filtration film 11 for removing dust such as particles, an ion exchange resin 12 for removing ions in the pure water, a deaeration film 13 for removing any dissolved gas in the pure water by using a vacuum pump 15, and an activated carbon filter 14 for removing any organic substance in the pure water are provided to the pure water supply channel 4. The resultant impurity removing unit removes impurities in the pure water. The storage tank 10 has a germicidal lamp 18 which can sterilize microbes. The impurity removing unit may have only some of the filtration film 11, ion exchange resin 12, deaeration film 13, and activated carbon filter 14 described above, or may have at least one of, e.g., a reverse osmosis film and distillation unit, in addition to or in place of them.

In place of the deaeration film 13, nitrogen may be charged in the space in the storage tank 10 or in the pure water in the storage tank 10, so that dissolved oxygen in the pure water may be removed.

The filtration film 11, ion exchange resin 12, deaeration film 13, and activated carbon filter 14 need not be disposed in the pure water supply channel 4, but can be set to form an impurity removing channel 5 parallel to the pure water supply channel 4. In this case, typically, the respective units disposed in the impurity removing channel 5 are sufficient as far as they can process pure water having a flow rate smaller than that of the pure water to be supplied to the exposure apparatus. Hence, even if the pure water supply apparatus increases in size due to the presence of the respective units, the size increase may be within an allowable range.

APPLICATION

Figure 4:
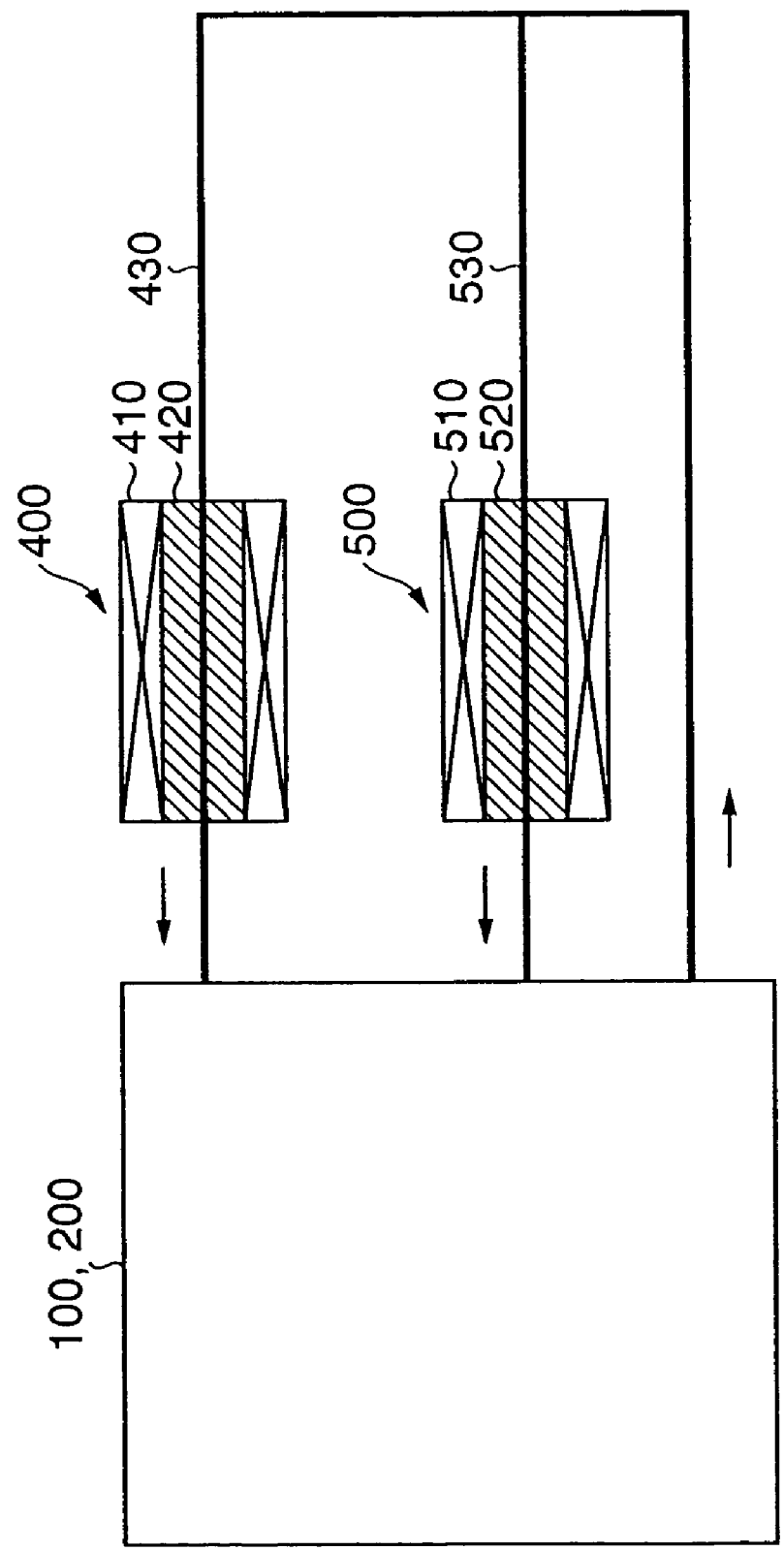
FIG. 4 is a view schematically showing an exposure apparatus as an example of a device manufacturing apparatus.

An exposure apparatus as an example of a device manufacturing apparatus in which the pure water supply apparatus described above is incorporated will be described. FIG. 4 is a view schematically showing the exposure apparatus. This exposure apparatus has a reticle stage (not shown), a linear motor 400 as a driving section for the reticle stage, a wafer stage (not shown), a linear motor 500 as a driving section for the wafer stage, a projection optical system (not shown), a reticle illumination system, and the like. In this exposure apparatus, a reticle pattern is transferred onto a wafer with a slit beam while moving a reticle held by the reticle stage and a wafer held by the wafer stage relative to each other. Such an exposure apparatus is called a scanning exposure apparatus. The pure water supply apparatus described above can be applied not only to a scanning exposure apparatus, but also to an exposure apparatus of a type called a stepper and to other types of exposure apparatuses. In the stepper, generally, with the reticle being fixed, a reticle pattern is sequentially transferred to a plurality of shot regions while stepping the wafer.

The application shown in FIG. 4 has a pure water supply apparatus 100 (200) which supplies a cooling medium (pure water) to the linear motor 400 for driving the reticle stage, and a pure water supply apparatus 100 (200) which supplies the cooling medium (pure water) to the linear motor 500 for driving the wafer stage.

The linear motors 400 and 500 respectively have cores 420 and 520 and coils 410 and 510 wound on the cores 420 and 520. The pure water supplied from the pure water supply apparatus 100 (200) absorbs heat of the coils 410 and 510 while it circulates through circulation flow channels 430 and 530 including refrigerant flow channels formed in the cores 420 and 520.

The pure water supply apparatus 100 (200) described above can be applied to a device manufacturing apparatus other than the exposure apparatus, e.g., a CVD apparatus, an etching apparatus, and the like. In this case, the cooling target is, e.g., a wafer chuck in the apparatus.

DEVICE MANUFACTURING METHOD

Figure 5:
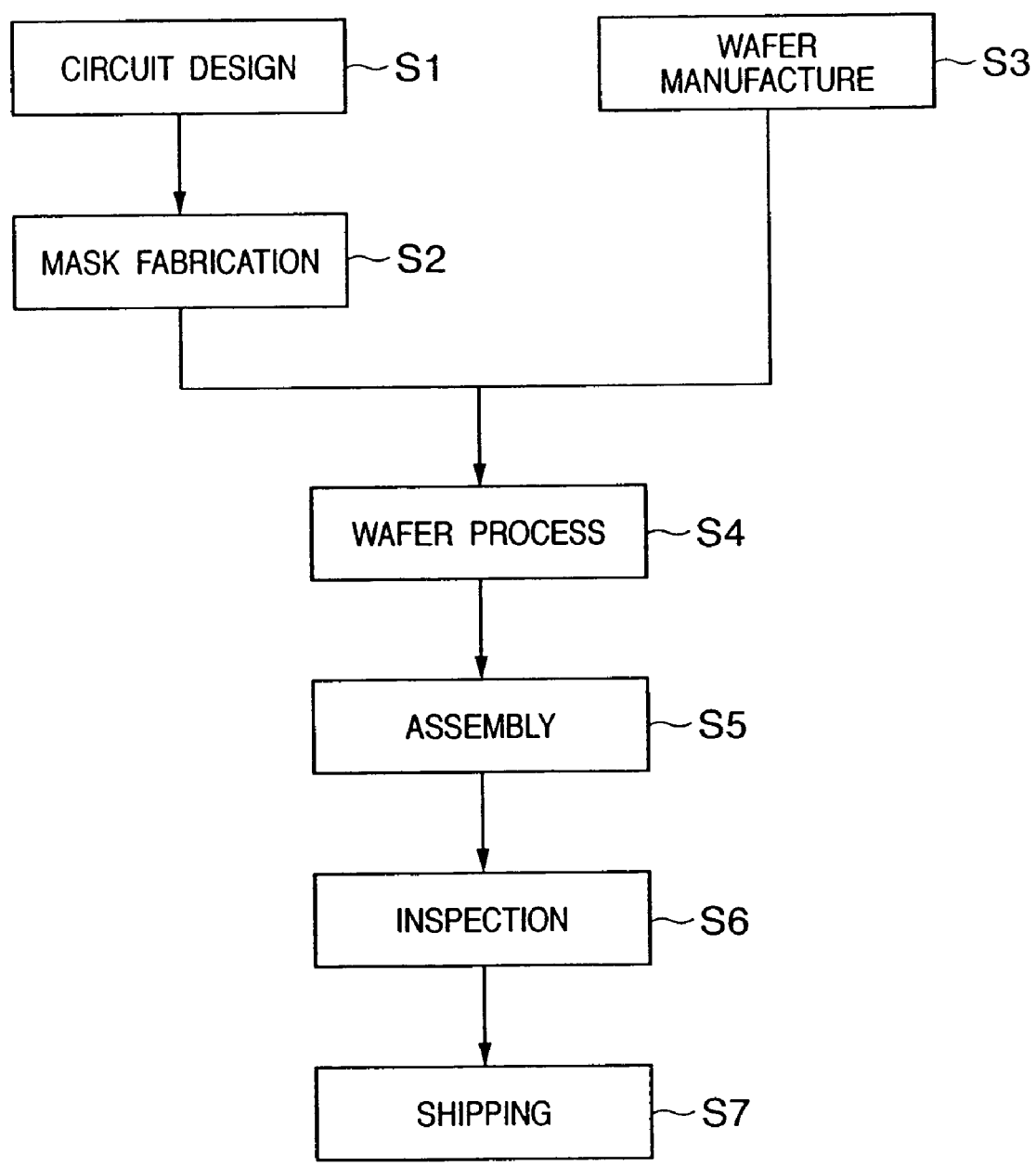
FIG. 5 is a flow chart showing the flow of an overall semiconductor device manufacturing process.

A semiconductor device manufacturing process utilizing the above exposure apparatus will be described. FIG. 5 is a flow chart showing the flow of an overall semiconductor device manufacturing process. In step 1 (circuit design), the circuit of a semiconductor device is designed. In step 2 (mask fabrication), a mask is fabricated based on the designed circuit pattern. In step 3 (wafer manufacture), a wafer is manufactured using a material such as silicon. In step 4 (wafer process), called a preprocess, an actual circuit is formed on the wafer by lithography using the mask and wafer described above. In step 5 (assembly), called a post-process, a semiconductor chip is formed from the wafer fabricated in step 4. This step includes processes such as assembly (dicing and bonding) and packaging (chip encapsulation). In step 6 (inspection), inspections including an operation check test and a durability test of the semiconductor device fabricated in step 5 are performed. A semiconductor device is completed with these processes, and is shipped (step 7).

Figure 6:
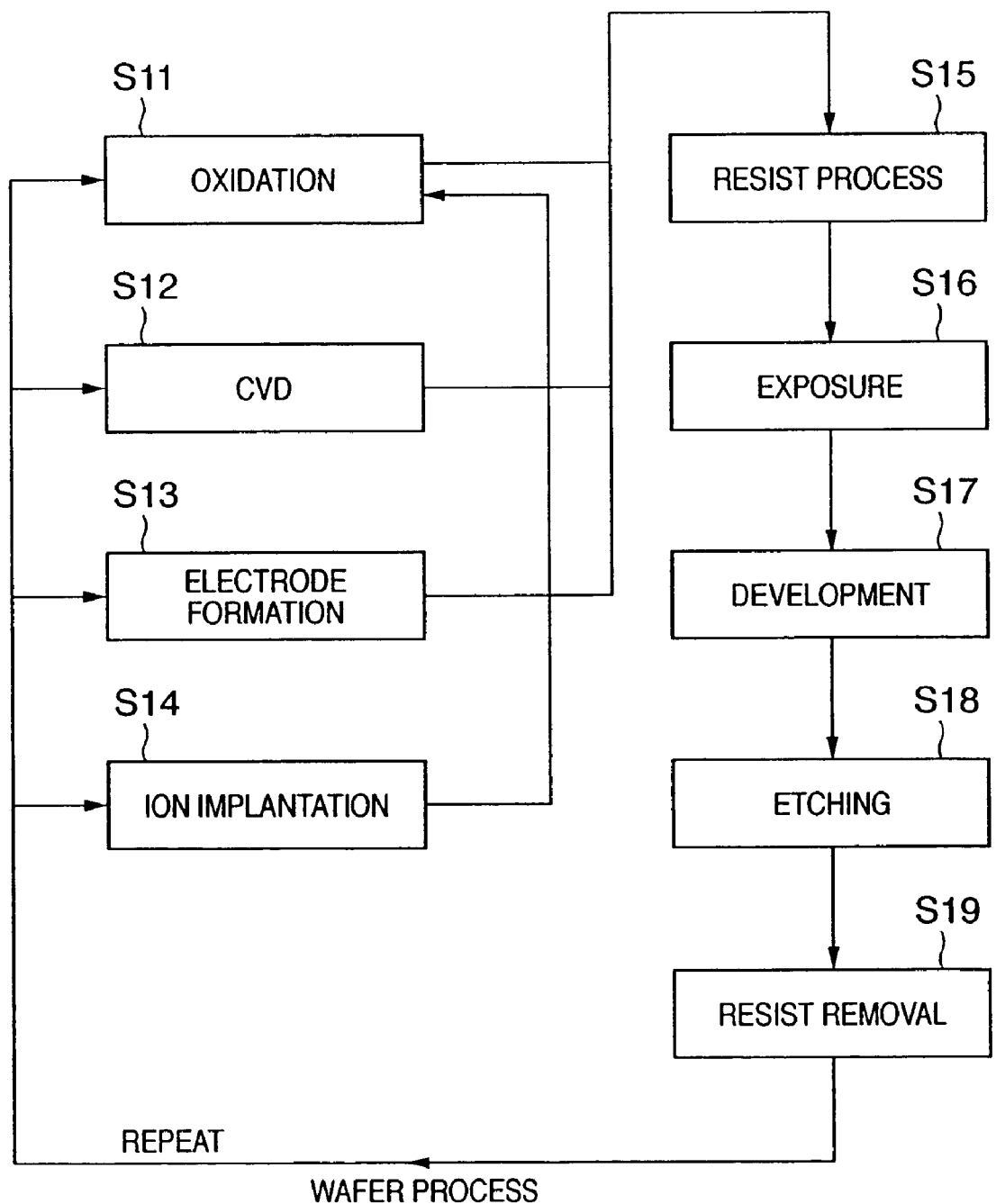
FIG. 6 is a flow chart showing the detailed flow of a wafer process.

FIG. 6 is a flow chart showing the detailed flow of the wafer process described above. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern is transferred to the wafer by the exposure apparatus described above. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

According to the present invention, a refrigerant supply apparatus which contributes to downsizing of, e.g., a cooling system, and a device manufacturing apparatus including such a refrigerant supply apparatus can be provided.

As many apparently widely different embodiments of the present invention can be made without departing from the spirit and scope thereof, it is to be understood that the invention is not limited to the specific embodiments thereof except as defined in the claims.

What is claimed is:

1. A refrigerant supply apparatus for supplying a refrigerant to a cooling target, the apparatus comprising:
    a refrigerant supply channel through which pure water as the refrigerant is supplied to the cooling target;
    an impurity removing unit disposed in an impurity removing channel which is a channel different from said refrigerant supply channel;
    a sensor which measures a purity of the pure water;
    a valve which stops supply of the pure water to the cooling target when the purity of the pure water does not satisfy a predetermined standard;
    a first pump provided to said refrigerant supply channel; and
    a second pump provided to said impurity removing channel,
    wherein said first and second pumps are controlled independently of each other, such that said first pump is stopped when the purity of the pure water does not satisfy the predetermined standard, and that said second pump is stopped when the purity of the pure water satisfies the predetermined standard.

2. The apparatus according to claim 1, wherein said sensor includes a resistivity sensor.

3. The apparatus according to claim 1, wherein said sensor includes a dissolved oxygen sensor.

4. A device manufacturing apparatus comprising:
    a driving section which generates heat;
    a refrigerant supply channel through which pure water as a refrigerant is supplied to a cooling section that cools said driving section;
    a sensor which is disposed in said refrigerant supply channel and measures a purity of the pure water;
    a controller which controls supply of the pure water to said cooling section on the basis of the purity of the pure water measured by said sensor;
    a first pump provided to said refrigerant supply channel; and
    a second pump provided to an impurity removing channel,
    wherein said first and second pumps are controlled independently of each other, such that said first pump is stopped when the purity of the pure water does not satisfy the predetermined standard, and that said second pump is stopped when the purity of the pure water satisfies the predetermined standard.

5. The apparatus according to claim 4, wherein said controller stops supply of the pure water to said cooling section when the purity of the pure water does not satisfy a predetermined standard.

6. The apparatus according to claim 4, wherein said sensor includes a resistivity sensor.

7. The apparatus according to claim 4, wherein said sensor includes a dissolved oxygen sensor.

8. The apparatus according to claim 4, further comprising an impurity removing unit which removes impurities in the pure water.

9. The apparatus according to claim 8, wherein said impurity removing unit is disposed in an impurity removing channel which is a channel different from said refrigerant supply channel.

10. The apparatus according to claim 8, wherein said impurity removing unit is disposed in a branch channel of said refrigerant removing channel.

11. The apparatus according to claim 8, wherein said impurity removing unit includes at least one of an ion exchange resin, active carbon, a filtration film, a reverse osmosis film, a distillation unit, and a deaeration film.

12. The apparatus according to claim 4, further comprising a germicidal lamp which sterilizes the pure water.

13. The apparatus according to claim 4, further comprising a pure water tank which stores the pure water, wherein an upstream side of said refrigerant supply channel is connected to said pure water tank.

14. The apparatus according to claim 13, wherein a lower portion of said pure water tank has a tapered shape.

15. The apparatus according to claim 13, further comprising an oxygen removing mechanism which removes dissolved oxygen in the pure water by supplying an inert gas into said pure water tank.

16. The apparatus according to claim 15, wherein said oxygen removing mechanism supplies the inert gas into the pure water in said pure water tank.

17. The apparatus according to claim 4, further comprising a temperature adjustment unit which adjusts a temperature of the pure water.

18. The apparatus according to claim 4, which is formed as an exposure apparatus.

19. A device manufacturing method including a step of processing a substrate using the device manufacturing apparatus according to claim 4.

20. A device manufacturing method including steps of:
   transferring a pattern to a substrate with the device manufacturing apparatus according to claim 18; and
   developing the substrate.

* * * * *